United States Patent
Verkuil

[19]

[11] Patent Number: 6,104,206
[45] Date of Patent: Aug. 15, 2000

[54] PRODUCT WAFER JUNCTION LEAKAGE MEASUREMENT USING CORONA AND A KELVIN PROBE

[76] Inventor: Roger L. Verkuil, 37 Sherwood Hts., Wappinger Falls, N.Y. 12590

[21] Appl. No.: 08/906,199

[22] Filed: Aug. 5, 1997

[51] Int. Cl.[7] .............................. G01R 31/26; G01R 1/04
[52] U.S. Cl. ...................... 324/765; 324/766; 324/158.1; 324/767
[58] Field of Search .................................. 324/765, 766, 324/158.1, 767

[56] References Cited

U.S. PATENT DOCUMENTS

| Re. 29,918 | 2/1979 | Verkuil | 324/767 |
|---|---|---|---|
| 4,015,203 | 3/1977 | Verkuil | 324/767 |
| 4,739,252 | 4/1988 | Malaviya et al. | 324/115 |
| 4,812,756 | 3/1989 | Curtis et al. | 324/750 |
| 5,030,908 | 7/1991 | Miyoshi et al. | 324/755 |
| 5,216,362 | 6/1993 | Verkuil | 324/767 |
| 5,485,091 | 1/1996 | Verkuil | 324/455 |
| 5,498,974 | 3/1996 | Verkuil et al. | 324/767 |
| 5,519,193 | 5/1996 | Freiermuth et al. | 324/501 |
| 5,594,328 | 1/1997 | Lukaszek | 324/72 |

*Primary Examiner*—Safet Metjahic
*Assistant Examiner*—Jermele M. Hollington
*Attorney, Agent, or Firm*—Pearne & Gordon LLP

[57] ABSTRACT

Corona charge is applied to a semiconductor product wafer to reverse bias PN junctions. Measurements of voltage decay in the dark and in the light are made and combined to determine a PN junction leakage characteristic. A portion of the dark measurement is taken in the light to permit normalizing the light and dark measurements.

7 Claims, 4 Drawing Sheets

PRODUCT WAFER JUNCTION LEAKAGE MEASUREMENT USING CORONA AND A KELVIN PROBE

BACKGROUND OF THE INVENTION

The present invention relates to the testing of semiconductor product wafers and, in particular, to the contactless measurement of junction leakage on product wafers.

It is often desirable to make PN junction leakage measurements on product wafers that contain the many PN junctions created in the fabrication process. A simple qualitative leakage measurement may be obtained by examining the median leakage behavior of all the junctions on single chip. This can be done by exciting junctions with light and then examining the area weighted average of the photovoltaic decay of the junctions with one large capacitive sensor that is the approximate size of a product chip. Such a simple method works well when one particular type of junction dominates the general area of the chip. However, quite often, there will be competing opposite polarity surface photovoltage signals from other type junctions on the same chip.

U.S. Pat. No. 4,812,756 shows a method for making general leakage measurements on a wafer utilizing corona charge and is incorporated herein by reference.

SUMMARY OF THE INVENTION

A method for measuring junction leakage in a semiconductor product wafer using corona charge includes: measuring the decay of corona charge voltage on the wafer in darkness; measuring the decay of corona charge voltage on the wafer in light; and determining a junction leakage characteristic according to the light decay and dark decay voltage measurements.

DESCRIPTION OF THE PREFERRED EMBODIMENTS

Figure 1:
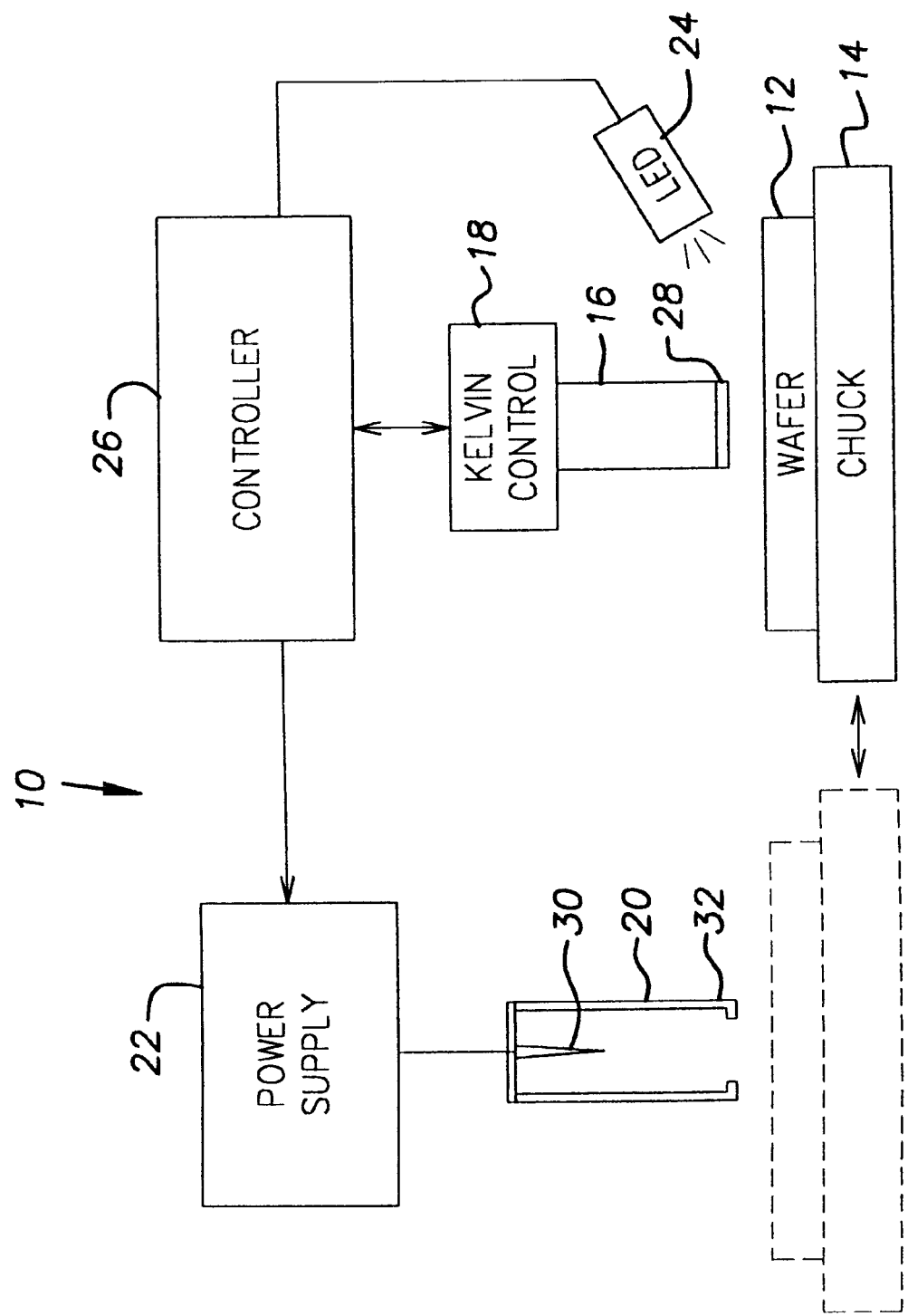
FIG. 1 is a block diagram of an apparatus suitable for practicing the invention.

Referring to FIG. 1, an apparatus 10 for measuring junction leakage on a product wafer 12 includes a vacuum chuck 14, a Kelvin probe 16, a Kelvin probe controller 18, a corona gun 20, a corona power supply 22, a light source 24 and a system controller 26.

The chuck 14 (and the wafer 12) is moveable between positions under the Kelvin probe 16 and the corona gun 20 by a translation stage (not shown) that is controlled by the controller 26. As an alternative, the Kelvin probe 16 and the corona gun can be translated with respect to a stationary chuck 14.

The Kelvin probe 16 includes a circular (e.g., 6 mm diameter) capacitive pick-up plate 28 for sensing the electrical potential of the surface of the wafer 12. The Kelvin probe controller 18 includes a mechanism to vibrate the pick-up plate 28 above the wafer 12 to produce a time-varying and hence capacitively coupled signal representing the potential of the surface of the wafer 12 with respect to the chuck 14. The Kelvin probe controller 18 also includes an amplifier/detector for the signal from the pick-up plate 28. The Kelvin probe controller 18 operates under the control of the controller 26 and provides a measure of the surface voltage of the portion of the wafer 12 under the pick-up plate 28. The pick-up plate 28 is positioned, for example, an average distance above the wafer 12 of 5–10 mils.

The corona gun 20 includes a corona emitter 30 (e.g., a tungsten carbide needle) connected to the corona power supply 22 (e.g., ±8,000 volts). A conductive cylindrical enclosure 32 about the emitter 30 helps to produce a uniform flow of corona charge from the corona gun 20. The opening in the enclosure 32 is, for example, 9 mm in diameter. Depending on the polarity of the power supply 22, positive or negative corona charge will be deposited on the portion of the wafer 12 located beneath the corona gun 20. The operation of the corona gun 20 and the power supply 22 is controlled by the controller 26.

The light source 24 is positioned to allow illumination of the portion of the wafer 12 located under the pick-up plate 28. The light source 24 is controlled by the controller 26. The light source 24 may be, for example, a red LED.

The controller 26 may include, for example, a general purpose computer programmed to control the apparatus 10 and to perform measurements according to the invention.

The corona charge is used to reverse bias the junctions of interest in the wafer 12. The polarity of the corona charge applied determines which type junctions are reverse biased. N type regions on top of P type regions require positive corona charge, while P type regions on top of N type regions require negative corona charge. A forward biased junction exhibits a potential of at most, for example, 0.6 volts, but a reverse biased junction can exhibit a much higher junction potential (e.g., several volts). This helps the leakage of the junctions of interest to dominate the measurement.

After the proper polarity corona charge is deposited, the leakage current density in reverse biased junctions (in the absence of other leakage mechanisms) can be described as $I=C_j^* dV_j/dt$, where $C_j$ is the capacitance per unit area of the junctions of interest and $V_j$ is the voltage transient observed on the surface of the wafer. In reality, for a typical wafer, $V_j$ will be due to not only the reverse biased junction leakage, but also the various oxide related leakage paths, such as, bleed-off of the corona charge due to surface conduction paths from the top of the oxide to nearby hole openings down to the silicon, and leakage through the oxide itself.

This assumes that the process is being done in the dark. If the wafer is illuminated, all of the junctions will tend to be forward biased. In this case, $V_j$ will depend primarily on just the insulator behavior (plus a steady state offset due to a light induced forward junction bias voltage).

It should be noted that the voltages measured by the Kelvin probe 16 will be due to the area-weighted superposition of the voltage transients from all the individual chip junctions that lie under the pick-up plate 28. The size of the pick-up plate 28 can be varied to better accommodate the size of individual dies on a wafer to make chip by chip measurements on the wafer. During measurements, the Kelvin probe 16 and the corona gun 20 are aligned with the area of interest on the wafer 12.

The measurement of the junction leakage for a particular type junction in the wafer begins with using the Kelvin probe 16 to measure the initial potential of the area of interest of the wafer 12 under the pick-up plate 28. The apparatus 10 is in darkness and the light source 24 is off.

The wafer 12 is then moved under the corona gun 20 and the correct polarity of corona charge from the corona gun 20 is applied to the wafer 12 to reverse bias the type junction of interest.

The wafer 12 is then moved rapidly under the Kelvin probe 16 (e.g., within 150 milliseconds) and the voltage transient is measured by the Kelvin probe 16 for a first interval of time (e.g., 10 seconds). In general, the first interval will be in a range of 3 to 10 seconds.

The light source 24 is then turned on and the voltage transient measured for a second interval (e.g., 2 seconds). In general the second interval will be in a range of 1 to 3 seconds.

The light source 24 is then turned off and the voltage transient measured for a third interval (e.g., 5 seconds). In general, the third interval will be in a range of 5 to 10 seconds.

The voltage transients for the first through third time intervals can be considered a first or dark voltage characteristic.

The wafer 12 is then moved back under the corona gun 20 and, using opposite polarity corona charge, the potential of the wafer 12 is restored to the initial measured potential. The wafer 12 can be moved back and forth between the corona gun 20 and the Kelvin probe 16 until this original potential is reached.

The original polarity of corona charge from the corona gun 20 is then applied to the wafer 12 to reverse bias the type junction of interest.

The wafer 12 is then moved rapidly under the Kelvin probe 16, the light source 24 turned on, and the voltage transient measured for an interval corresponding to the first through third intervals (e.g., 17 seconds). This voltage transient can be considered to be a second or light voltage characteristic.

During the second time interval, the light source 24 will tend to rapidly forward bias the junctions on the wafer 12. It has been discovered that the voltage transient during this interval should correspond to the same time slot in the light voltage characteristic.

In general, the dark voltage characteristic is primarily a combination of the leakage of the junctions of interest and the insulator behavior; and the light voltage characteristic is primarily the insulator behavior.

Using the common interval of illumination, one or the other voltage characteristic is scaled to match the other for this interval and then the difference between the characteristics is taken. This results in a junction leakage characteristic that depends primarily on the leakage of the junctions of interest plus a steady state offset due to a light induced PN junction forward bias voltage.

Further, because this steady state offset decays to zero within a decay interval (e.g., 5 seconds) after the light 24 is turned off during the dark characteristic, the junction leakage characteristic can be further corrected by subtracting an offset such that the characteristic is zero at a point in time corresponding to the end of the second interval plus the decay interval. In general, the decay interval will be 3 to 5 seconds.

If the leakage in a wafer is particularly high or low, it may be necessary to proportionally adjust the intervals used in the measurements to insure that the junction leakage of interest occurs primarily within the first interval and that the second interval still includes an oxide leakage component.

The junction leakage characteristic provides a graphic indication of the junction leakage. In addition, the formula set forth above can be used to convert the characteristic to actual leakage current density, where $C_j$ can be determined, for example, empirically, or from a knowledge of the particular chip design. In general, $C_j$ will be relatively constant in comparison to the fluctuations in undesired defects and impurities that contribute to variations in junction leakage.

It should be noted that the order of determining the dark voltage characteristic and the light voltage characteristic can be readily interchanged. In addition, the measurements can be repeated several times and averaged to improve the accuracy of the results.

Figure 2:
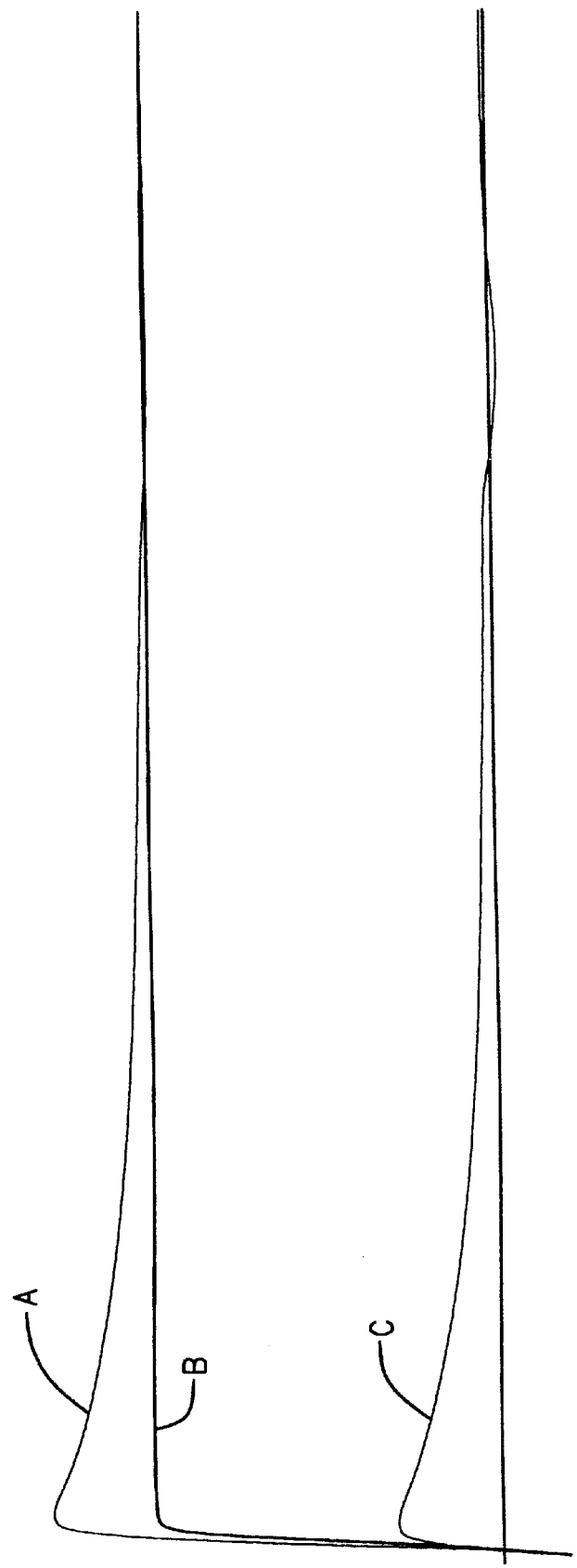
FIG. 2 is an exemplary graph of a measurement according to the invention for N well/P epi junctions on a normal DRAM chip.

Referring to FIG. 2, N well/P epi junction leakage was measured according to the invention for a DRAM product wafer chip. Plot A is the dark voltage characteristic, plot B is the light voltage characteristic and plot C is the difference between the plots A, B after scaling and offset adjustment.

Figure 3:
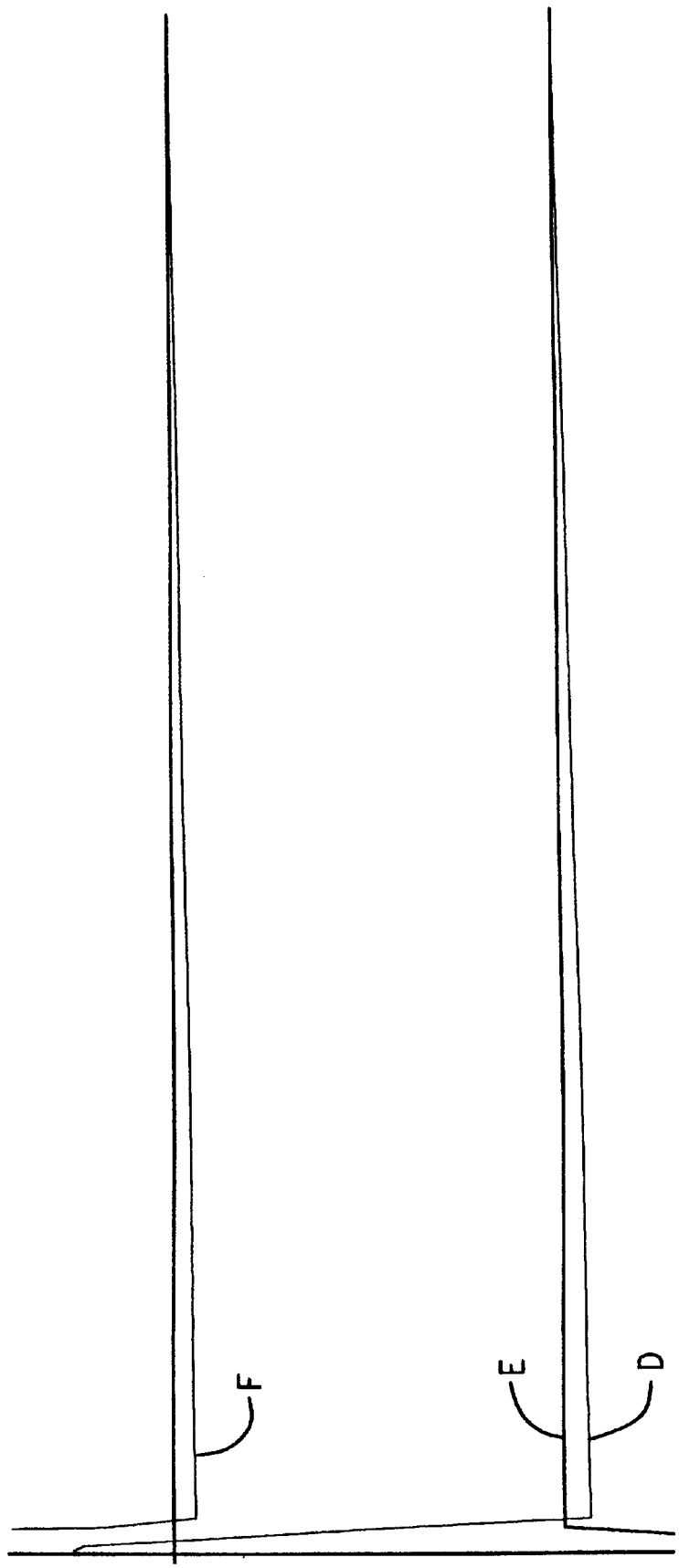
FIG. 3 is an exemplary graph of a measurement according to the invention for P source-drain/N well junctions on the same DRAM chip.

Referring to FIG. 3, the P source-drain/N well junction leakage for the same chip was determined. Plot D is the dark characteristic, plot E is the light characteristic and plot F is the leakage characteristic.

Figure 4:
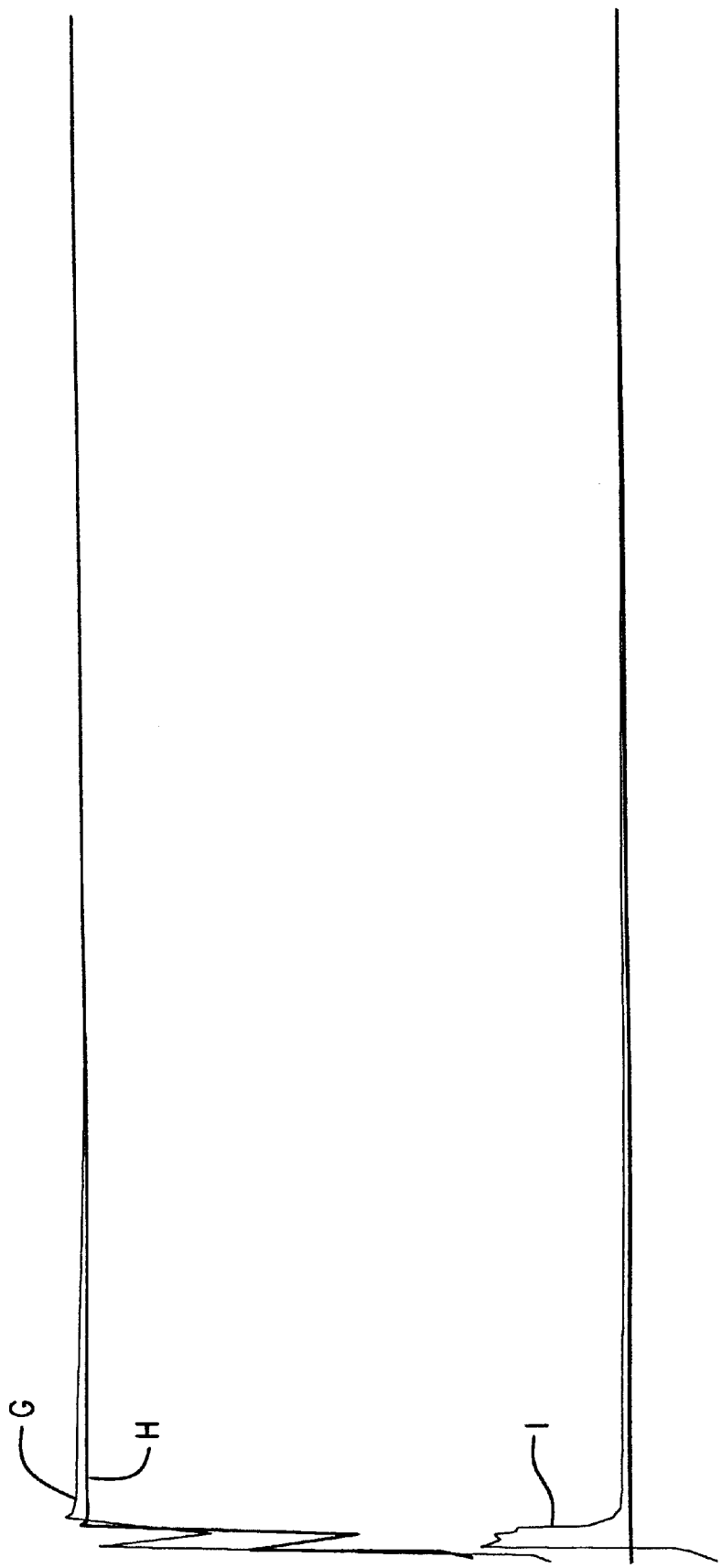
FIG. 4 is an exemplary graph of a measurement according to the invention for N well/P epi junctions on the same DRAM chip after contamination.

Referring to FIG. 4, N well/P epi junction leakage was measured according to the invention for the same chip after it had been heated in a contaminated mini furnace at about 700 degrees Celsius for several minutes. Plot G is the dark characteristic, plot H is the light characteristic and plot I is the leakage characteristic. The damage to the chip is readily apparent between FIG. 2 and FIG. 4.

Similar results were obtained as well for the P source-drain/N well junction leakage.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for measuring junction leakage in a semiconductor product wafer having a first type junction and a second type junction using corona charge, said method comprising:

applying corona charge to said wafer suitable to reverse bias one of said type junctions, said wafer being in a darkened environment and measuring a decay of corona charge voltage on the wafer in darkness;

applying corona charge to again reverse bias said one of said type junctions and measuring a decay of corona charge voltage on the wafer in light; and determining a junction leakage characteristic for said one of said type junctions according to said decay of corona charge voltage in light measurement and said decay of corona charge voltage in darkness measurement.

2. A method according to claim 1, wherein said measuring the decay of corona charge voltage on the wafer in darkness includes an intermediate period of measuring in light in addition to said measuring the decay of corona charge voltage on the wafer in light.

3. A method for measuring junction leakage in a semiconductor product wafer having a first type junction and a second type junction, said method comprising:

measuring an initial surface potential for said wafer;

applying corona charge to said wafer suitable to reverse bias one of said type junctions, said wafer being in a darkened environment;

measuring a first voltage transient for said wafer for a first time interval;

illuminating said wafer for a second time interval and measuring a second voltage transient for said wafer for said second time interval;

measuring a third voltage transient for said wafer in the darkened environment for a third time interval, said first, second, and third voltage transients together constituting a first voltage characteristic;

applying corona charge to said wafer to return said wafer to said initial surface potential;

applying corona charge to again reverse bias said one of said type junctions;

illuminating said wafer and measuring an additional voltage transient over a combined interval corresponding to said first through third intervals, said additional voltage transient for said combined interval constituting a second voltage characteristic; and determining a junction leakage characteristic for said one of said type junctions according to said first and second voltage characteristics.

4. A method according to claim 3, wherein said second voltage characteristic is scaled to correspond to said second interval voltage transient and subtracted from said first voltage characteristic to form said junction leakage characteristic.

5. A method according to claim 4, wherein an offset value is subtracted from said junction leakage characteristic such that said junction leakage characteristic is zero after a decay interval after said second interval.

6. A method according to claim 3, wherein said first voltage characteristic is scaled such that said second interval voltage transient corresponds to said second voltage characteristic and said second voltage characteristic is subtracted from said scaled first voltage characteristic to form said junction leakage characteristic.

7. A method according to claim 6, wherein an offset value is subtracted from said junction leakage characteristic such that said junction leakage characteristic is zero after a decay interval after said second interval.

* * * * *